United States Patent
Hazani

(10) Patent No.: US 11,362,540 B2
(45) Date of Patent: Jun. 14, 2022

(54) SYSTEMS AND METHODS FOR EFFICIENT POWER CONVERSION IN A POWER SUPPLY IN A POWER DISTRIBUTION SYSTEM

(71) Applicant: Corning Research & Development Corporation, Corning, NY (US)

(72) Inventor: Ami Hazani, Ra'anana (IL)

(73) Assignee: Corning Research & Development Corporation, Coming, NY (US)

( * ) Notice: Subject to any disclaimer, the term of this patent is extended or adjusted under 35 U.S.C. 154(b) by 97 days.

(21) Appl. No.: 16/881,460

(22) Filed: May 22, 2020

(65) Prior Publication Data

US 2020/0395781 A1     Dec. 17, 2020

Related U.S. Application Data

(60) Provisional application No. 62/861,840, filed on Jun. 14, 2019, provisional application No. 62/905,895, filed on Sep. 25, 2019.

(51) Int. Cl.

| | |
|---|---|
| *B60L 53/14* | (2019.01) |
| *B60L 58/20* | (2019.01) |
| *H02J 13/00* | (2006.01) |
| *H02M 1/42* | (2007.01) |
| *H02M 7/00* | (2006.01) |
| *H05K 7/20* | (2006.01) |
| *H02J 9/06* | (2006.01) |

(Continued)

(52) U.S. Cl.
CPC .......... *H02J 13/00007* (2020.01); *H02J 9/06* (2013.01); *H02M 1/4208* (2013.01); *H02M 7/003* (2013.01); *H05K 7/2039* (2013.01); *H02M 7/06* (2013.01); *H04W 84/045* (2013.01); *H04W 88/085* (2013.01)

(58) Field of Classification Search
CPC ...... H02M 1/0048; H02M 7/06; H02M 7/003; H02M 5/12; H02M 1/4225; H02M 1/4208; H02M 1/4291; H02J 9/06; H02J 13/00007; H02J 3/1807; Y02B 90/20; Y02B 70/10; H05K 7/2039; H04W 84/045; H04W 88/085; Y04S 20/12
See application file for complete search history.

(56) References Cited

U.S. PATENT DOCUMENTS 10,060,965 B1 *   8/2018   Skinner ............... G01R 31/086
2014/0314412 A1    10/2014   Soto et al.
(Continued)

*Primary Examiner* — Jared Fureman
*Assistant Examiner* — Esayas G Yeshaw
(74) *Attorney, Agent, or Firm* — C. Keith Montgomery

(57) ABSTRACT

Systems and methods for efficient power conversion in a power supply in a power distribution system are disclosed. In particular, a low frequency transformer having high conversion efficiency is coupled to an input from a power grid. An output from the transformer is rectified and then converted by a power factor correction (PFC) converter before passing the power to the distributed elements of the power distribution system. By placing the transformer in front of the PFC converter, overall efficiency may be improved by operating at lower frequencies while preserving a desired power factor and providing a desired voltage level. The size and cost of the cabinet containing the power conversion circuitry is minimized, and operating expenses are also reduced as less waste energy is generated.

21 Claims, 10 Drawing Sheets

(51) Int. Cl.
  *H04W 88/08* (2009.01)
  *H02M 7/06* (2006.01)
  *H04W 84/04* (2009.01)

(56) References Cited

U.S. PATENT DOCUMENTS

2020/0313421 A1* 10/2020 Dusmez .................. H02H 5/04
2021/0155100 A1*  5/2021 Khaligh ................. B60L 53/22
2021/0170890 A1*  6/2021 Iyer ........................ H02P 27/08

* cited by examiner

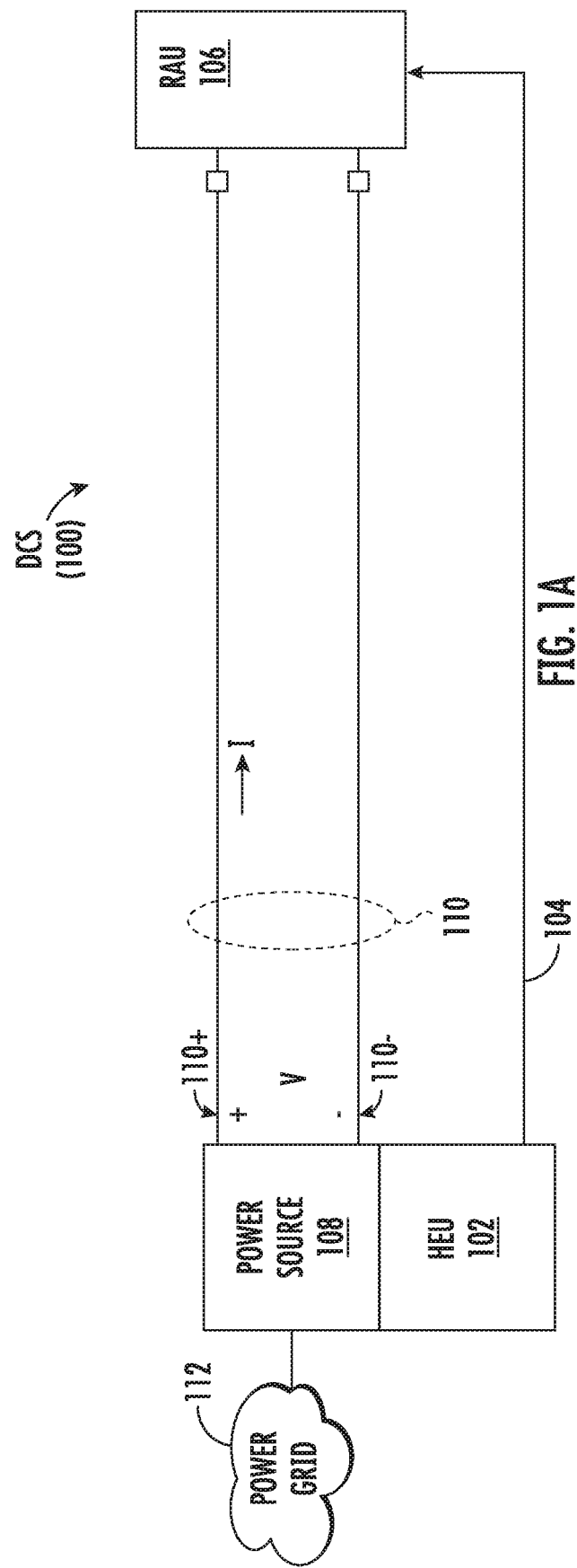

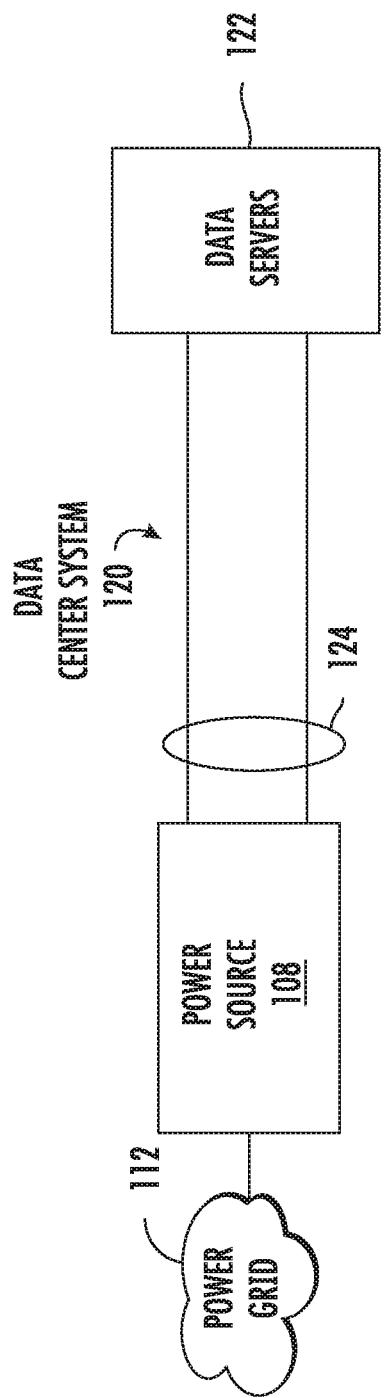
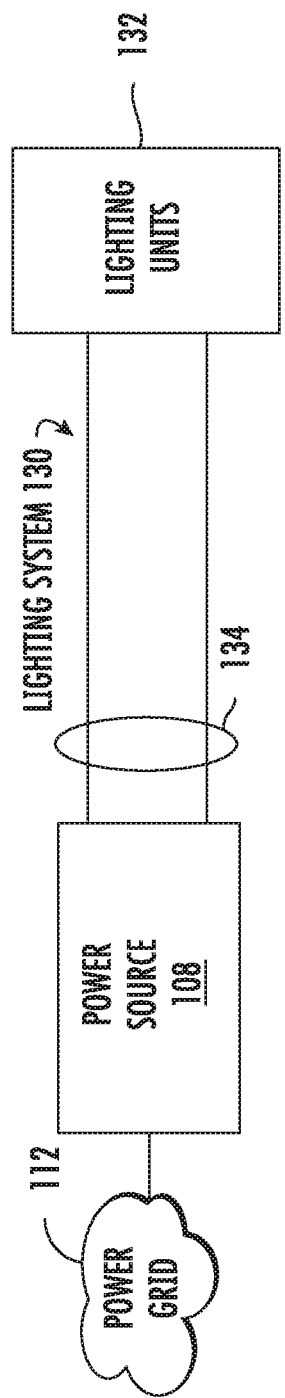
FIG. 1B
FIG. 1C

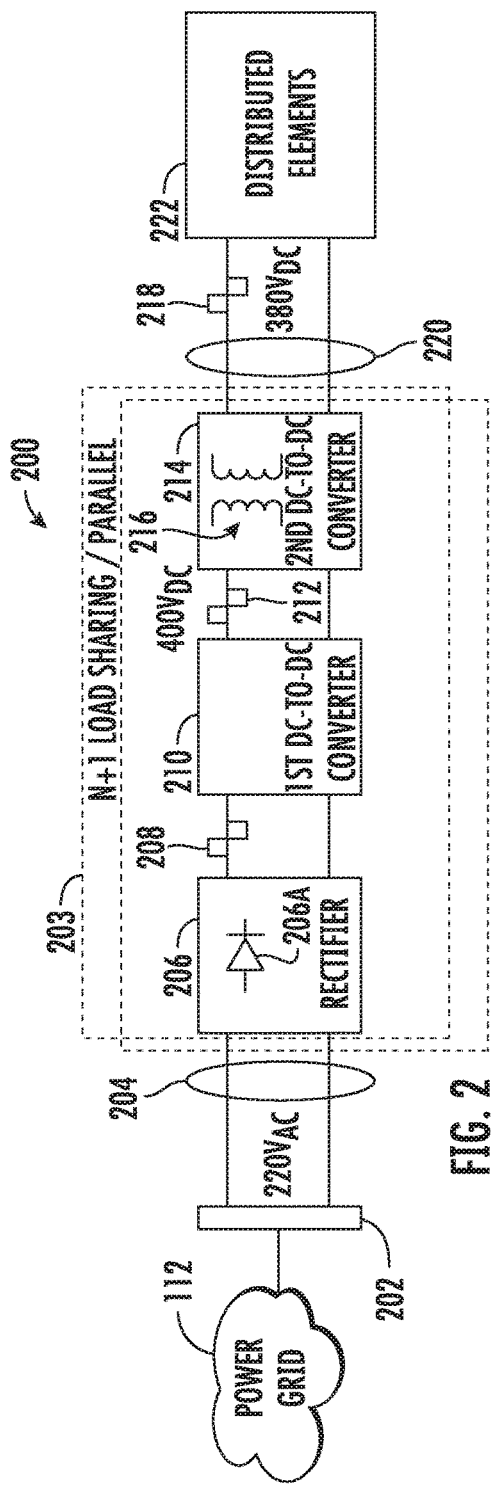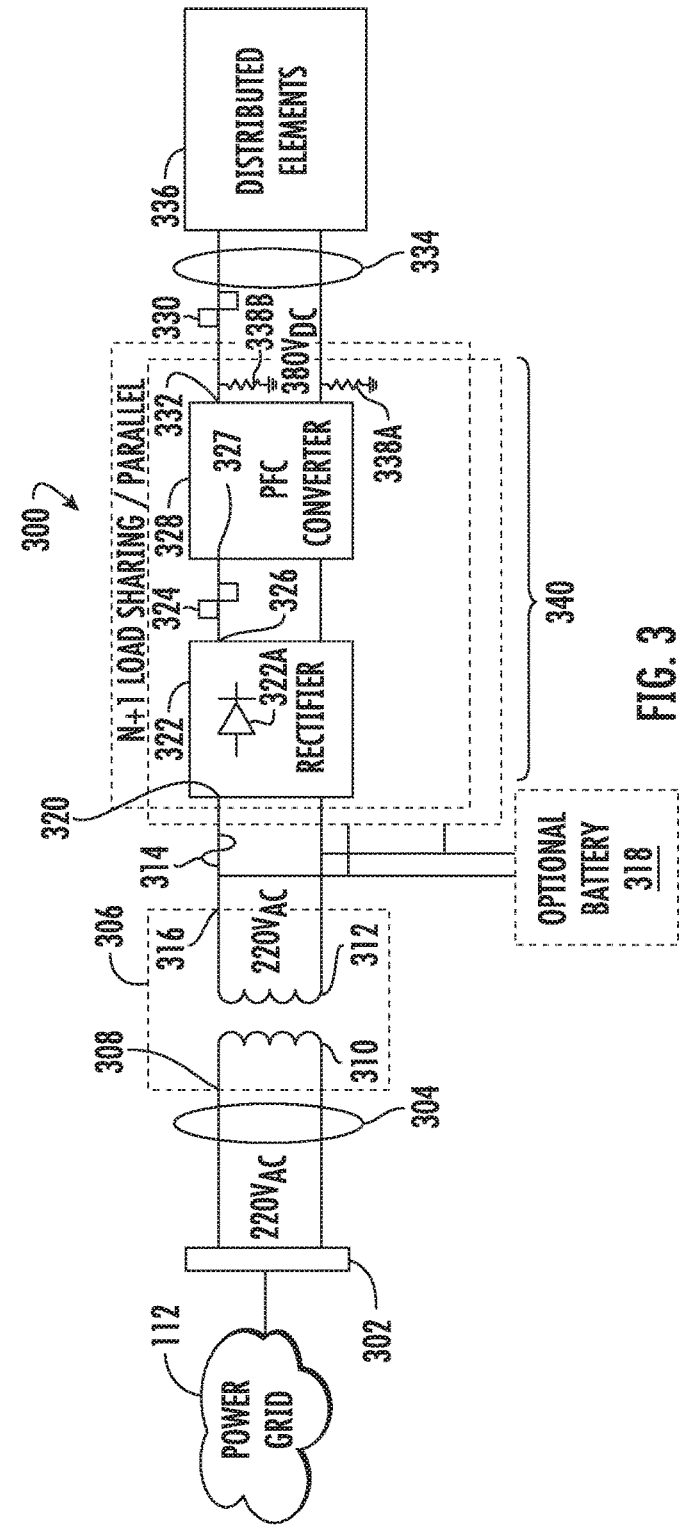

SYSTEMS AND METHODS FOR EFFICIENT POWER CONVERSION IN A POWER SUPPLY IN A POWER DISTRIBUTION SYSTEM

CROSS-REFERENCE TO RELATED APPLICATIONS

The present application claims priority under 35 U.S.C. § 119(e) to U.S. Provisional Patent Application Ser. No. 62/861,840 entitled "HIGH EFFICIENCY POWER SUPPLIES" and filed on Jun. 14, 2019, which is incorporated herein by reference in its entirety.

The present application also claims priority under 35 U.S.C. § 119(e) to U.S. Provisional Patent Application Ser. No. 62/905,895 entitled "SYSTEMS AND METHODS FOR EFFICIENT POWER CONVERSION IN A POWER SUPPLY IN A POWER DISTRIBUTION SYSTEM" and filed on Sep. 25, 2019, which is incorporated herein by reference in its entirety.

BACKGROUND

The disclosure relates generally to distribution of power to one or more power consuming devices over power wiring and, more particularly, to power conversions that may occur from an external power source for use by remote units of a distributed system.

Electrical power consumption is prevalent throughout modern society. Provision of electrical power requires power generation and power delivery through a power grid to a destination, where the power must be conditioned to an appropriate level for use at the destination. In some instances, the destination is merely an intermediate destination, with further downstream destinations. In such a case, power may be passed on through a sub-network or sub-grid to such further downstream destinations.

In most power grid systems, the electrical power is sent at relatively high voltages and low currents in an alternating current (AC) format so that power losses on transmission lines are kept comparatively low pursuant to Ohm's Law relating to power dissipation (e.g., for a simple model, power dissipated equals the square of current multiplied by resistance (i.e., $I^2R$)). This high voltage signal is then converted to a lower voltage level suitable for use at the destination. When there are further downstream destinations, additional power loss may occur at voltage level conversion.

A few exemplary destinations that have further downstream destinations include remote lighting systems, data centers, and distributed communication systems. In most cases, the power arrives from the power grid at a relatively high AC voltage and is converted to direct current (DC) with an adjusted voltage level. The circuitry to perform such conversions induces power loss in the form of heat because of low efficiencies. Further, such circuitry is typically expensive because it operates in relatively high frequencies to conserve space and may be temperature limited. For example, many commercial products for such circuitry begin to become increasingly less efficient at temperatures above fifty degrees centigrade (50° C.) and even more steeply less efficient at temperatures above seventy-five degrees centigrade (75° C.). Some implementations have implemented air conditioning or heat exchangers to help ameliorate these heat limitations, but both solutions impose penalties in terms of cost, size, and/or providing additional potential points of failure.

Accordingly, there is room for an improved power conversion system for use with a reduced cost of installation (capital expense) as well as a reduced operating expense profile.

No admission is made that any reference cited herein constitutes prior art. Applicant expressly reserves the right to challenge the accuracy and pertinency of any cited documents.

SUMMARY

Embodiments of the disclosure relate to systems and methods for efficient power conversion in a power supply in a power distribution system. In particular, a low frequency transformer having high conversion efficiency is coupled to an input from a power grid. An output from the transformer is rectified and then converted by a power factor correction (PFC) converter before passing the power to the distributed elements of the power distribution system. By placing the transformer in front of the PFC converter, overall efficiency may be improved by operating at lower frequencies while preserving a desired power factor and providing a desired voltage level. The size and cost of the cabinet containing the power conversion circuitry is minimized, and operating expenses are also reduced as less waste energy is generated.

One embodiment of the disclosure relates to a power distribution system, comprising a power management circuit (PMC). The PMC comprises a power source input port configured to receive an alternating current (AC) power signal from an external power grid. The PMC also comprises a transformer for providing isolation between the external power grid and a power distribution line. The transformer comprises a transformer input port coupled to the power source input port. The transformer also comprises at least one input coil coupled to the transformer input port. The transformer also comprises at least one output coil coupled to the at least one input coil. The transformer also comprises a transformer output port coupled to the at least one output coil. The PMC also comprises a rectifier. The rectifier comprises an AC input port coupled to the transformer output port. The rectifier also comprises a rectifier output port. The rectifier is configured to change the AC power signal into a first DC power signal having a first voltage level and provide the first DC power signal at the rectifier output port. The PMC also comprises a PFC converter. The PFC converter comprises a converter input port coupled to the rectifier output port. The PFC converter also comprises a converter output port. The PFC converter is configured to generate a second DC power signal having a second voltage level different than the first voltage level. The converter output port is configured to be coupled to a power load.

An additional embodiment of the disclosure relates to a method for conditioning power for provision to a distributed power network. The method comprises receiving an AC power signal from a power grid. The method also comprises isolating a PMC from the power grid with a transformer. The method also comprises rectifying an output of the transformer to provide a rectified signal. The method also comprises performing a PFC conversion on the rectified signal. The method also includes providing power.

An additional embodiment of the disclosure relates to a distributed communication system (DCS). The DCS comprises a central unit. The central unit is configured to distribute one or more downlink communication signals over one or more downlink communication links to a plurality of remote units. The central unit is also configured to distribute received one or more uplink communication signals from the plurality of remote units from one or more uplink communication links to one or more source communication outputs. The DCS also comprises the plurality of remote units. Each remote unit among the plurality of remote units is configured to distribute at least one received downlink communication signal among the one or more downlink communication signals from the one or more downlink communication links to one or more client devices. Each remote unit is also configured to distribute the one or more uplink communication signals from the one or more client devices to the one or more uplink communication links. The DCS also comprises a power distribution circuit. The power distribution circuit comprises a power source input port configured to receive an AC power signal from an external power grid. The power distribution circuit also comprises a transformer for providing isolation between the external power grid and a power distribution line. The transformer comprises a transformer input port coupled to the power source input port. The transformer also comprises at least one input coil coupled to the transformer input port. The transformer also comprises at least one output coil coupled to the at least one input coil. The transformer also comprises a transformer output port coupled to the at least one output coil. The power distribution circuit also comprises a rectifier. The rectifier comprises an AC input port coupled to the transformer output port. The rectifier also includes a rectifier output port. The rectifier is configured to change the AC power signal into a first DC power signal having a first voltage level and provide the first DC power signal at the rectifier output port. The power distribution circuit also comprises a PFC converter. The PFC converter comprises a converter input port coupled to the rectifier output port. The PFC converter also comprises a converter output port. The PFC converter is configured to generate a second DC power signal having a second voltage level different than the first voltage level. The converter output port is configured to be coupled to the power distribution line to carry the second DC power signal thereover.

Additional features and advantages will be set forth in the detailed description which follows and, in part, will be readily apparent to those skilled in the art from the description or recognized by practicing the embodiments as described in the written description and claims hereof, as well as the appended drawings.

It is to be understood that both the foregoing general description and the following detailed description are merely exemplary and are intended to provide an overview or framework to understand the nature and character of the claims.

The accompanying drawings are included to provide a further understanding of the disclosure, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 1A is a schematic diagram of an exemplary distributed communication system (DCS) in the form of a distributed antenna system (DAS) illustrating a remote power source delivering power to a remote antenna unit (RAU);

FIG. 1B is a schematic diagram of an exemplary data center illustrating a remote power source delivering power to a data server;

FIG. 1C is a schematic diagram of an exemplary distributed lighting system illustrating a remote power source delivering power to a remote lightning element;

FIG. 2 is a schematic diagram of a conventional power conversion element at a remote power source with an inefficient transfer mechanism;

FIG. 3 is an exemplary schematic diagram of an efficient power conversion element according to an exemplary aspect of the present disclosure;

DETAILED DESCRIPTION

Figure 4A:
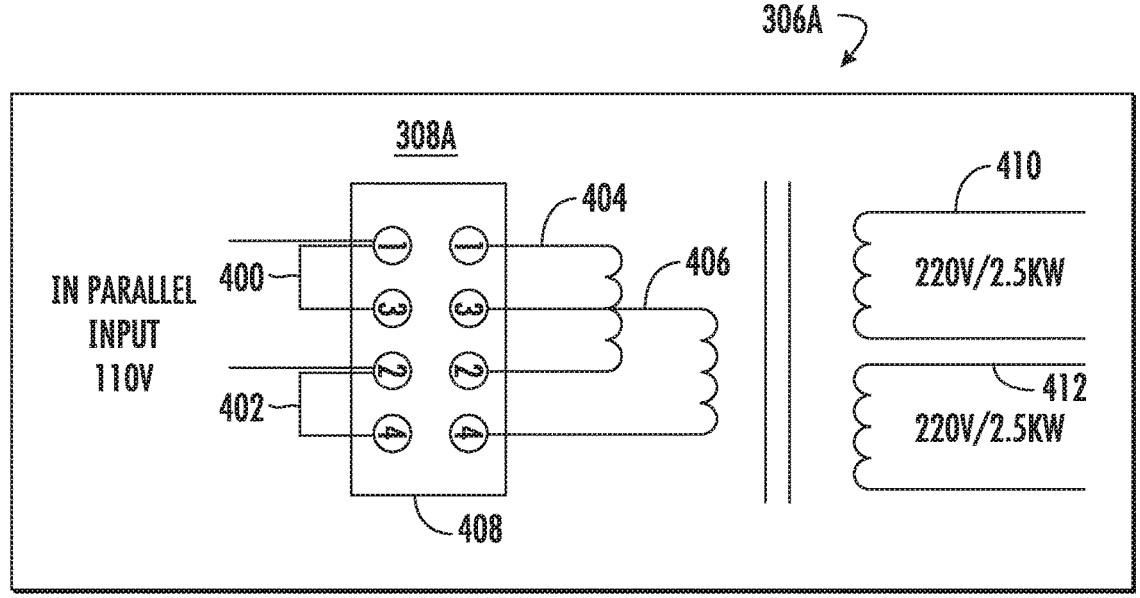
FIG. 4A is a simplified illustration of a parallel input transformer for use in the power conversion element of FIG. 3.

Embodiments of the disclosure relate to systems and methods for efficient power conversion in a power supply in a power distribution system. In particular, a low frequency transformer having high conversion efficiency is coupled to an input from a power grid. An output from the transformer is rectified and then converted by a power factor correction (PFC) converter before passing the power to the distributed elements of the power distribution system. By placing the transformer in front of the PFC converter, overall efficiency may be improved by operating at lower frequencies while preserving a desired power factor and providing a desired voltage level. The size and cost of the cabinet containing the power conversion circuitry is minimized, and operating expenses are also reduced as less waste energy is generated.

Before addressing particulars of the present disclosure, a brief discussion of power distribution systems that may benefit from the present disclosure is provided with reference to FIGS. 1A-1C. To further assist in understanding the advantages and differences of the present disclosure, a conventional power management circuit (PMC) is described with reference to FIG. 2. A discussion of the power management circuit of the present disclosure that is used in the systems of FIGS. 1A-1C begins below with reference to FIG. 3.

In this regard, FIG. 1A illustrates a simplified block diagram of a distributed communication system (DCS) 100. The DCS 100 may include a head end unit (HEU) 102 that communicates through a communication medium 104 with a remote antenna unit (RAU) 106. The communication medium 104 may be a wire-based or optical fiber medium. The RAU 106 includes a transceiver and an antenna (not illustrated) that communicate wirelessly with mobile terminals and other user equipment (also not illustrated). Because the RAU 106 sends and receives wireless signals and may potentially perform other functions, the RAU 106 consumes power. That power may, in some instances, be provided locally. More commonly, the RAU 106 receives power from a power source 108 that transmits power to the RAU 106 over power lines 110 formed from a positive power line 110+ and a negative power line 110−. The power lines 110 may be many meters long, for example, extending through an office building, across multiple floors of a multi-story building, or the like. Further, the power lines 110 may couple to multiple RAUs 106 (even though only one is illustrated in FIG. 1). The power source 108 may be coupled to an external power grid 112. The external power grid 112 may be operated by a power company and may carry a high voltage (e.g., 35,000 volts (V)), low frequency (e.g., 50 hertz (Hz) or 60 Hz (or in some rare instances 400 Hz)) alternating current (AC) power signal on high power lines, although the voltage level is typically stepped down to 100 V AC or 240 V AC. In contrast, the RAU 106 may use a 110 V or 220 V DC power signal. The power source 108 includes a PMC therein that changes the AC power signal of the external power grid 112 to a voltage level suitable for use by the RAU 106.

Similarly, FIG. 1B illustrates a data center system 120 having a power source 108 coupled to remote data servers 122 through power lines 124. The power source 108 is coupled to the external power grid 112 and includes a PMC (not illustrated) according to the present disclosure. As with the RAU 106, the data servers 122 may need a different voltage signal than that provided by the external power grid 112.

Similarly, FIG. 1C illustrates a lighting system 130 having a power source 108 coupled to remote lighting units 132 through power lines 134. The power source 108 is coupled to the external power grid 112 and includes a PMC (not illustrated) according to the present disclosure. As with the RAU 106, the remote lighting units 132 may need a different voltage signal than that provided by the external power grid 112.

Historically, the PMC would operate at a high frequency so that internal components such as a transformer could be relatively small. Thus, as illustrated in FIG. 2, a PMC 200 may include a power source input 202 configured to be coupled to the external power grid 112. An AC power input signal 204 is passed from the power source input 202 to a rectifier 206 containing a diode 206A. The AC power input signal 204 may be, for example, 220 V AC, having already been stepped down from the high voltage of the external power grid 112. The rectifier 206 converts the AC power input signal 204 into a DC power signal 208. The DC power signal 208 is provided to a first non-isolated DC-to-DC converter 210 that acts as a power factor converter to assure that the phase between the voltage and current is fixed at a desired level. The first non-isolated DC-to-DC converter 210 may also step up the voltage in an intermediate DC power signal 212 to 400 V (or step down the voltage depending on the input voltage). The intermediate DC power signal 212 is provided to a second isolated DC-to-DC converter 214, which includes a transformer 216. The transformer 216 may be a relatively high frequency device and accordingly, may be relatively small, but may not have a high efficiency. In fact, the overall efficiency of the PMC 200 may be between 85-95%, largely due to the transformer 216 within the second isolated DC-to-DC converter 214. The second isolated DC-to-DC converter 214 may further step down the voltage to a desired voltage level such as, for example, 380 V (or as low as 48 V or 57 V), in an output signal 218. The output signal 218 may be output onto a power distribution line 220 for distribution to one or more distributed elements 222. The distributed elements 222 may be RAUs, lighting elements, or data servers.

While the PMC 200 may be relatively small, it may suffer from low efficiency as explained above. This inefficient behavior results in power loss in the form of heat. Unfortunately, such heat degrades performance of the PMC 200 such that less power is output. Most commercially available PMCs begin to lose power output at 50° C. Given that current requirements mandate operation at temperatures at or above 60° C. for applications that are outdoors such as solar fields or other outdoor systems as well as some indoor installations such as above the ceilings where there is limited airflow or other heavy industrial/manufacturing environments, such commercially available PMCs are inadequate. One way this inadequacy is addressed is through the use of an air conditioning unit. Such an air conditioning unit imposes an additional power requirement on the power distribution system and imposes a size penalty on the cabinet in which the PMC may be located. An alternate technique is through the use of a heat exchanger. However, such a heat exchanger imposes a substantial size penalty on the cabinet.

Exemplary aspects of the present disclosure address the deficiencies of the PMC 200 by providing an improved design which inverts the position of the transformer and allows the transformer to operate at low frequencies, which improves the overall efficiency of the PMC, reduces heat losses, and improves performance without imposing an undue size penalty on the PMC. Accordingly, the improved PMC described below with reference to FIG. 3 is readily deployed in outdoor environments without the need for an air conditioning apparatus or heat exchangers.

In this regard, FIG. 3 illustrates a PMC 300 according to an exemplary aspect of the present disclosure. The PMC 300 may include a power source input port 302 configured to be coupled to the external power grid 112. A power input signal 304 is passed from the power source input port 302 to a transformer 306 and, particularly, to a transformer input port 308. In an exemplary aspect, the transformer 306 is housed in a separate casing from other portions of the PMC 300. As the power input signal 304 is typically a low frequency AC signal, such as 60 Hz in the United States or 50 Hz in Europe, the transformer 306 may be a relatively high efficiency transformer (e.g., in excess of 99% efficient). This low frequency operation may result in a larger transformer compared to the transformer 216 of FIG. 2, but compared to the heat exchanger and air conditioning equipment required for the high frequency transformer 216, the net result is still a smaller overall device. The transformer 306 includes at least one input coil 310 and at least one output coil 312, although as explained below with reference to FIGS. 4A and 4B, there may be more than one input coil and more than one output coil. Further, if there is a three-phase AC input, there may be three different transformers, each connected to a different AC input phase. The rest of the discussion will focus on a single phase input. As is understood, the input coil 310 couples magnetically to the output coil 312 and creates an AC power signal 314 at a transformer output port 316. The transformer 306 helps isolate the external power grid 112 from the remainder of the PMC 300 as well as any downstream elements within a power distribution network associated with the PMC 300.

With continued reference to FIG. 3, the transformer 306 outputs the AC power signal 314, which may still be at a line voltage level such as 220 V. The AC power signal 314 or a signal from an optional battery 318 is provided to an AC input port 320 of a rectifier 322. The rectifier 322 changes the AC power signal 314 into a first DC power signal 324 available at a rectifier output port 326. The rectifier 322 may include a diode 322A. The first DC power signal 324 is provided to a converter input port 327 on a PFC converter 328. In an exemplary aspect, the PFC converter 328 may be a DC-to-DC converter. The PFC converter 328 acts as a power factor correction converter to assure that the phase between the voltage and current consumption is fixed at a desired level and may also step up the voltage to a higher voltage (e.g., 380 V) (or step down to a lower voltage) in a second DC power signal 330 provided at a converter output port 332. The PFC converter 328 also makes sure the second DC power signal 330 may be output onto a power distribution line 334 for distribution to one or more distributed elements 336. Alternatively, the converter output port 332 may be coupled to a local load (not shown) and power provided thereto. The distributed elements 336 may be RAUs, lighting elements, or data servers. It should be noted that the optional battery 318 may be advantageously positioned to the secondary side of the transformer 306 as illustrated so that the battery 318 may be optimized (i.e., have a narrower input voltage range closely correlated to the operating voltage) regardless of the AC voltage from the grid. Further note that the battery 318 may more properly be any form of uninterruptable power supply (UPS) or an AC battery.

To provide a balanced output power signal 330, resistors 338A and 338B may be connected to the converter output port 332 or the power distribution line 334. The resistors 338A and 338B may be identical, and may for example, be five kiloohms (5 kΩ). Note that there may be instances where a balanced output power signal is not needed. For example, if a coax cable is used to provide power, one of the conductors is always grounded (i.e., the shield). In the absence of a balancing circuit such as the resistors 338A and 338B, an unbalanced, relative to ground, output signal may be provided if desired.

By moving the transformer in front of the rectifier and using a low frequency AC transformer, the overall efficiency of the PMC 300 may be in excess of 98%. This provides a substantial power savings and appurtenant reduction in waste heat. The reduction in waste heat allows the elimination of air conditioning equipment and/or a heat exchange structure.

As a note of nomenclature, PMC 300 refers to the circuitry between and including the power source input port 302 and the converter output port 332. It should be appreciated, that the transformer 306 (and the battery 318) may be distinct from the rectifier 322 and PFC converter 328. For ease of distinguishing these, the combination of the rectifier 322 and the PFC converter 328 is referred to herein as a power conditioning element 340.

While the discussion above relating to FIG. 3 provides a single output, it should be appreciated that there may be plural outputs. The PMC 300 may be readily modified to accommodate such plural outputs. The transformer 306 provides plural outputs to multiple rectifier/PFC converter pairs. It may be appropriate to provide multiple outputs when different power factors are desired.

Figure 4B:
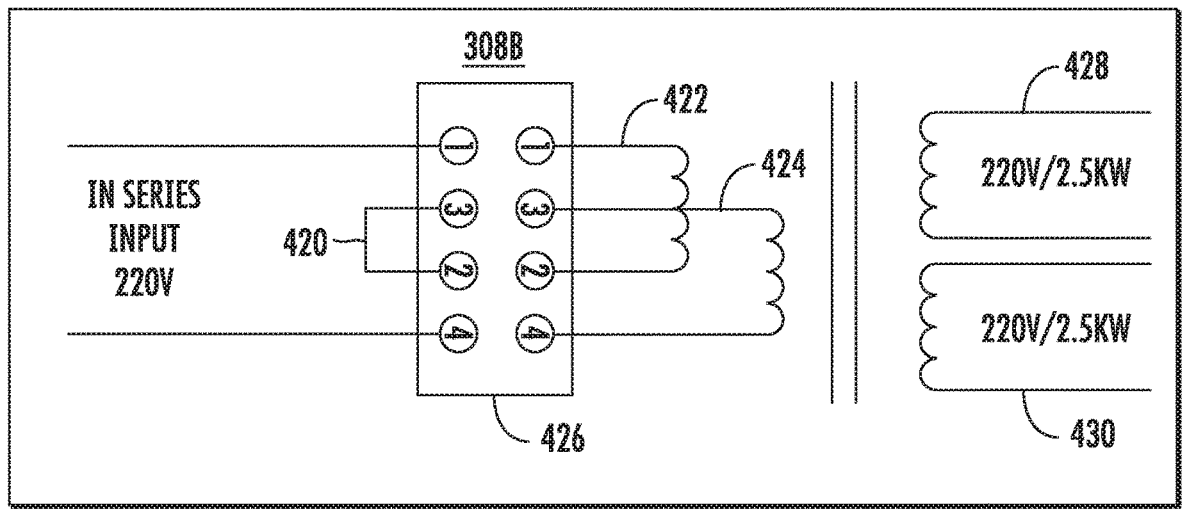
FIG. 4B is a simplified illustration of a series input transformer for use in the power conversion element of FIG. 3.

To achieve such plural outputs from the transformer 306, a modification to the transformer input port 308 may be made as illustrated in FIGS. 4A and 4B. In particular, in FIG. 4A, the transformer input port 308 of the transformer 306A may be modified to a parallel input port 308A. Jumpers 400 and 402 are used between electrical nodes 1-3 and 2-4 to provide input coils 404 and 406 between electrical nodes 1-2 and 3-4 on the output side of connection node 408. Output coils 410 and 412 couple to respective transformer output ports (not shown). Note that there is no requirement for multiple output coils, even if there are multiple input coils.

Similarly, in FIG. 4B, the transformer input port 308 of the transformer 306B may be modified to a series input port 308B. Jumper 420 is used between electrical nodes 2-3 to provide input coils 422 and 424 between electrical nodes 1-2 and 3-4 on the output side of connection node 426. Output coils 428 and 430 couple to respective transformer output ports (not shown). Again, note that there is no requirement for multiple output coils, even if there are multiple input coils.

Still other arrangements of the transformer 306 may be made without departing from the present disclosure to provide differing numbers of outputs. Likewise, the windings of the coils may be varied to achieve different power factors.

Figure 5A:
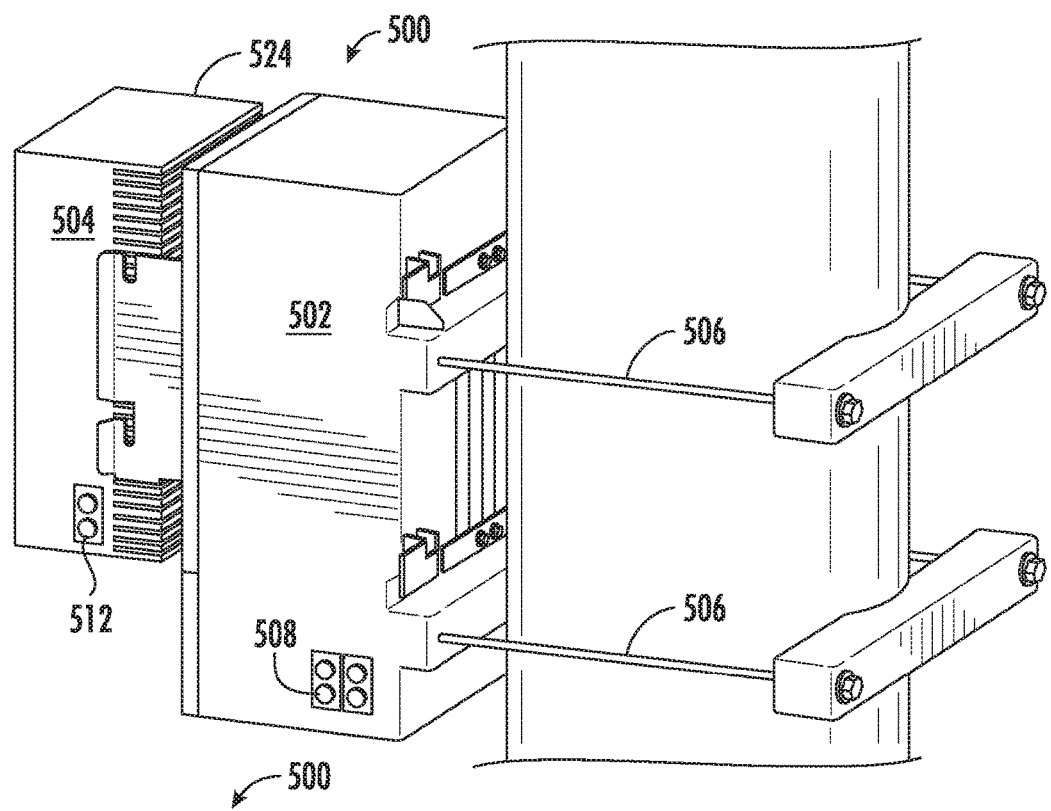
FIGS. 5A-5C are various views of an exemplary power conversion element installed in an outdoor environment.
Figure 5B:
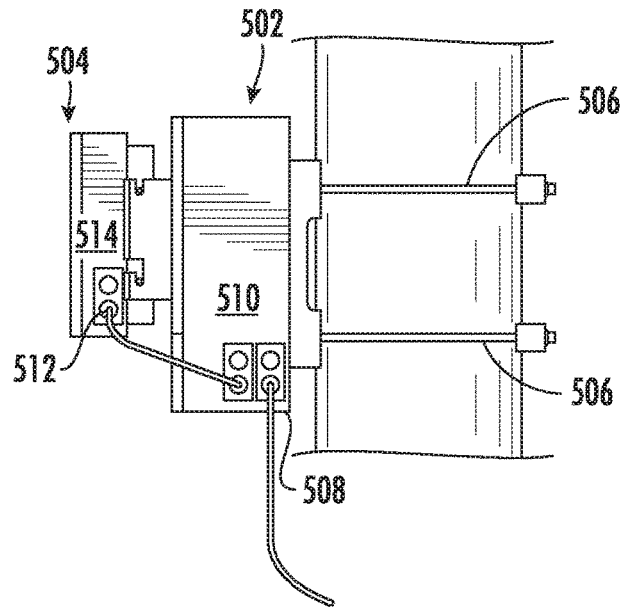
Figure 5C:
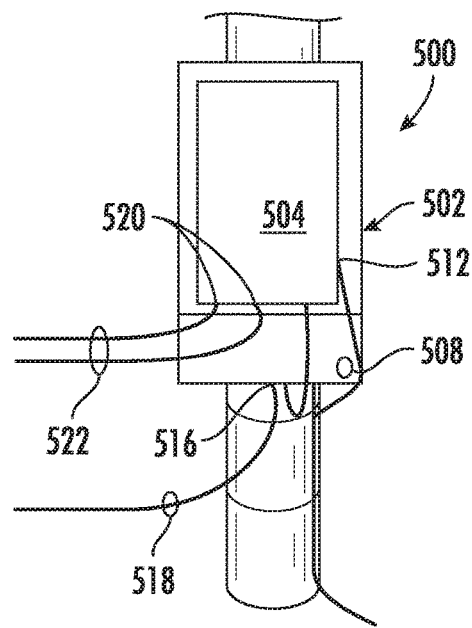

While the PMC 300 may be housed in a variety of structures, one such exemplary structure suitable for outside deployment is illustrated in FIGS. 5A-5C. In particular, a power conversion element 500 includes a transformer housing 502 and a power conditioning element housing 504. The transformer housing 502 may be affixed to a pole by U-shaped threaded members 506 or the like. The transformer housing 502 may contain the transformer 306 (FIG. 3) therein. Similarly, the power conditioning element housing 504 may contain the power conditioning element 340 therein. The transformer housing 502 may include a grounding screw element 508 secured on an external surface 510. In an exemplary aspect, the grounding screw element 508 may include two dual grounding contacts, one of which may be coupled to a grounding element 512 secured to an external surface 514 of the power conditioning element housing 504. The transformer housing 502 may be closed with an epoxy resin to render the housing waterproof as well as provide heat dissipation. The transformer housing 502 further may have a power input aperture 516 that receives a power cable 518 from the power grid 112. Likewise, the power conditioning element housing 504 may have power output apertures 520 that have power distribution cables 522 extending therefrom. Fins 524 may be integrally formed with the power conditioning element housing 504 to assist in heat dissipation. The power conditioning element housing 504 may contain other electronics or circuits to achieve functionality unrelated (or at best tangentially related) to the present disclosure. The use of the two housings 502 and 504 may help conduct heat away from the power conditioning element housing 504. That is, the heat of the transformer 306 may be conducted away from the PFC converter 328.

Figure 6:
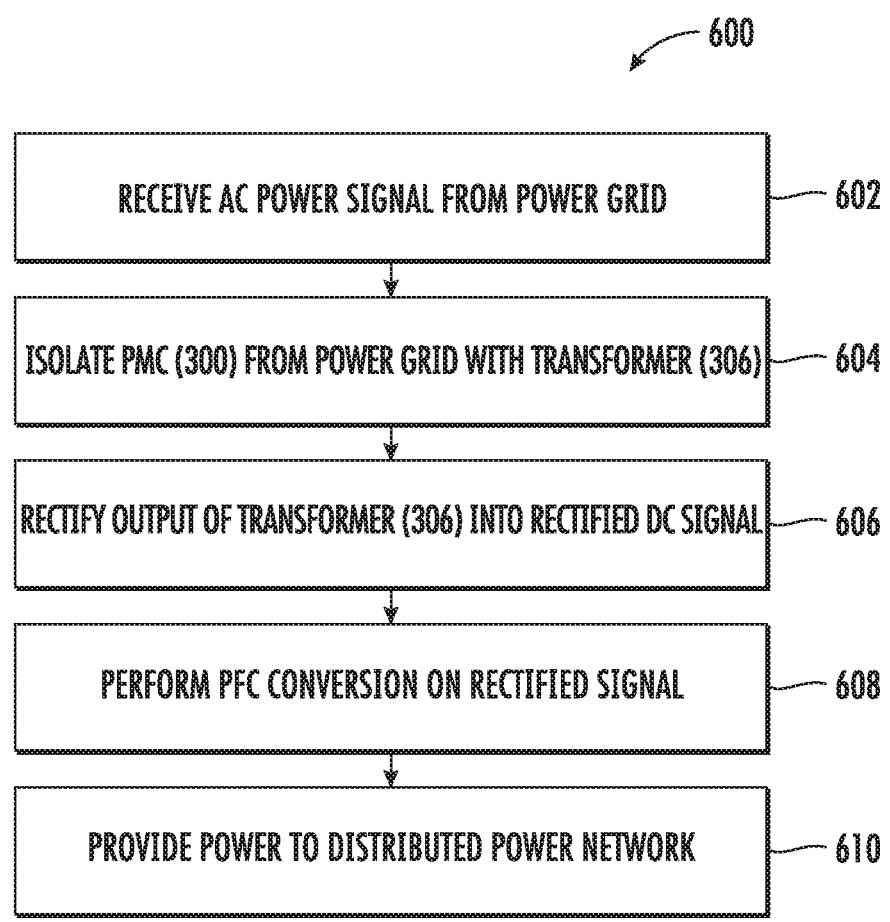
FIG. 6 is a flowchart illustrating an exemplary process of the power conversion element of FIG. 3 converting power to a desired level for use by a distributed power system.

Before providing a more detailed discussion of an exemplary distributed system in which the PMC 300 may be used, FIG. 6 provides a flowchart outlining a process 600 of using the PMC 300. In this regard, the process 600 begins when the PMC 300 receives an AC power signal from a power grid such as the external power grid 112 (block 602). The PMC 300 is isolated from the power grid with the transformer 306 (block 604). The output of the transformer 306 is rectified into a rectified DC signal (block 606) by the rectifier 322. The PFC converter 328 takes the rectified DC signal and performs a PFC conversion on the rectified signal (block 608), and power is provided to the distributed power network (block 610).

Figure 7:
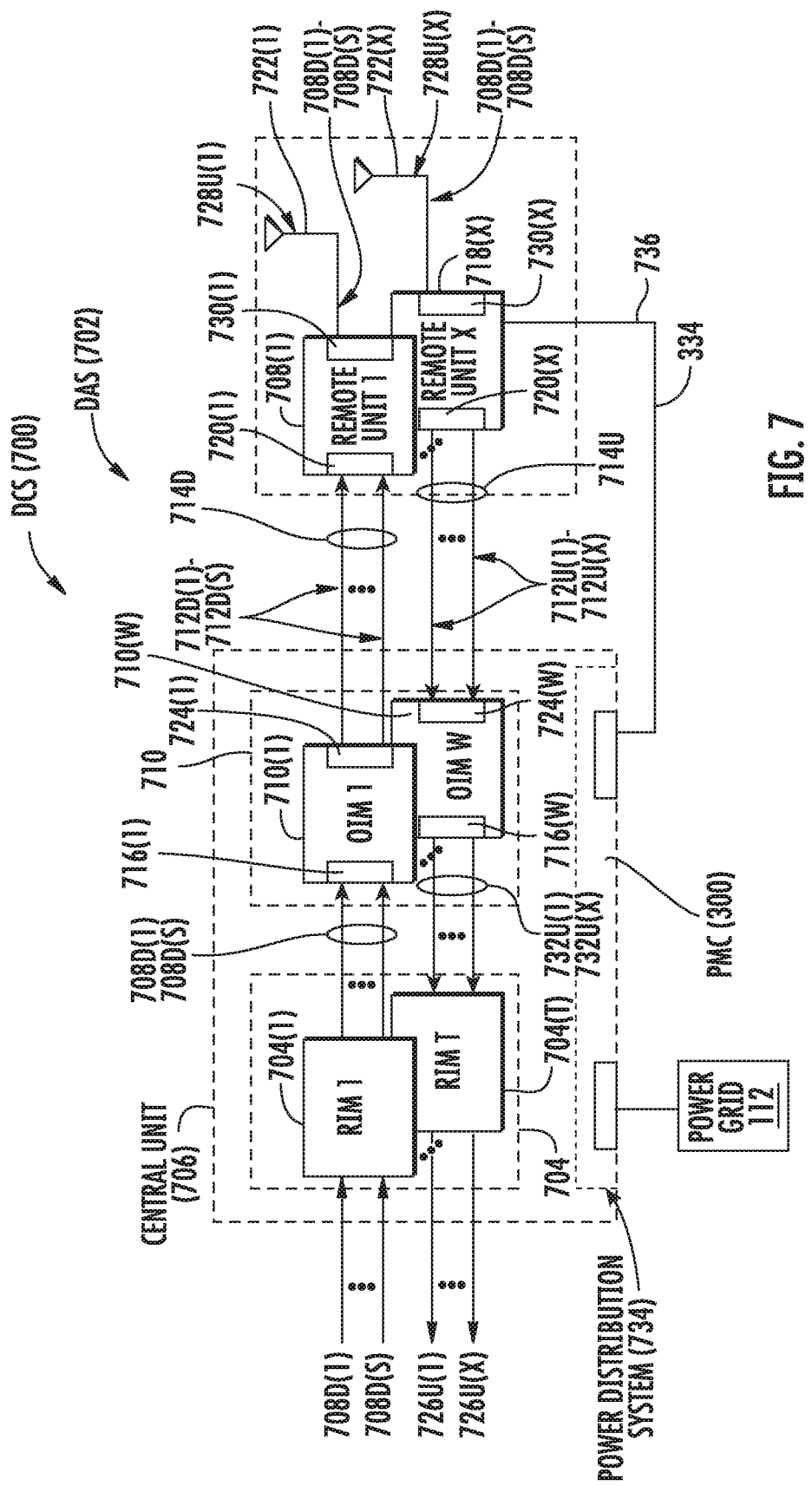
FIG. 7 is a schematic diagram of an exemplary optical-fiber based DCS in the form of a DAS that includes a power conversion element according to the present disclosure.
Figure 8:
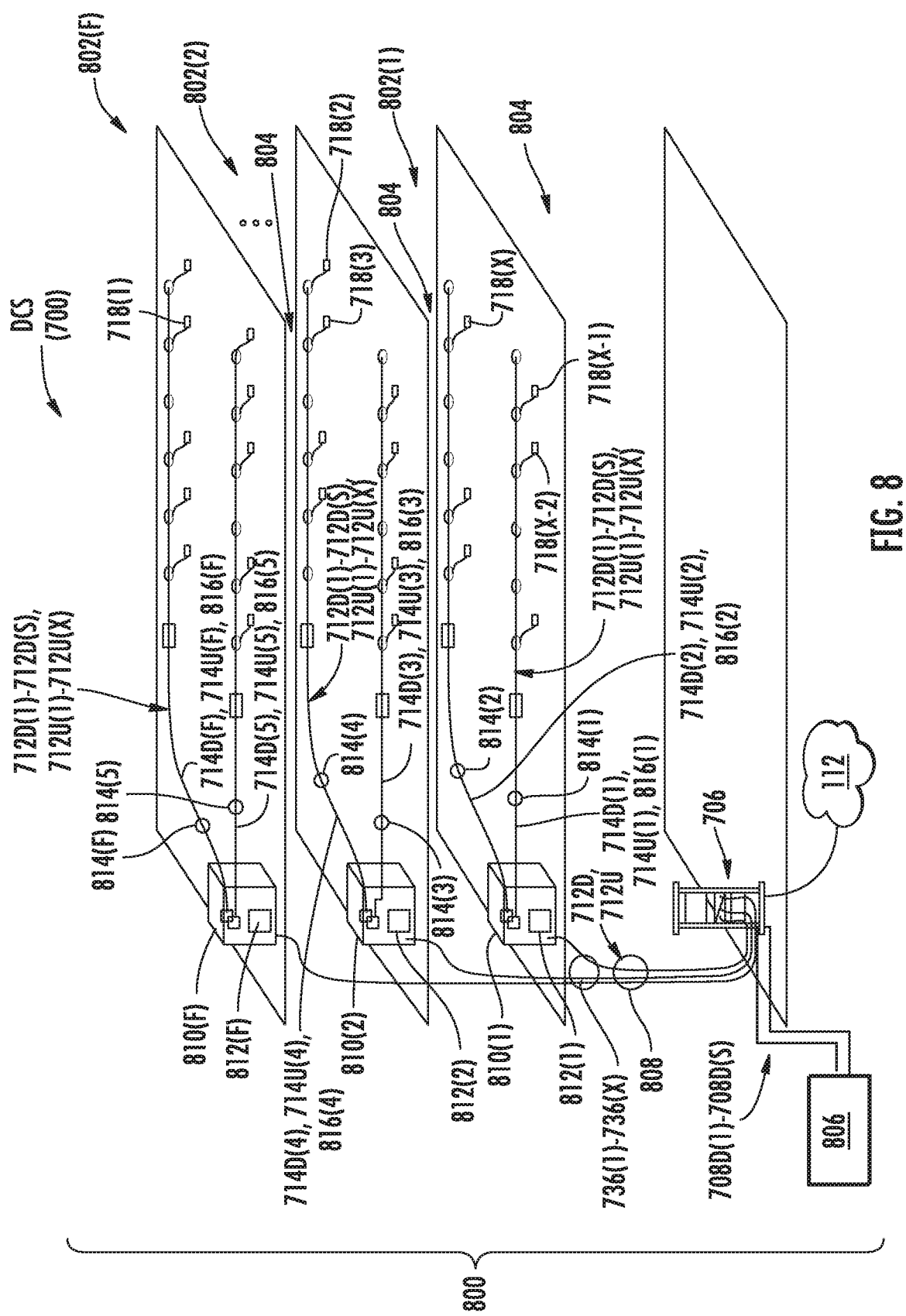
FIG. 8 is a schematic diagram of an exemplary building infrastructure with a deployed DCS and a power conversion element such as that proposed in FIG. 3.
Figure 9:
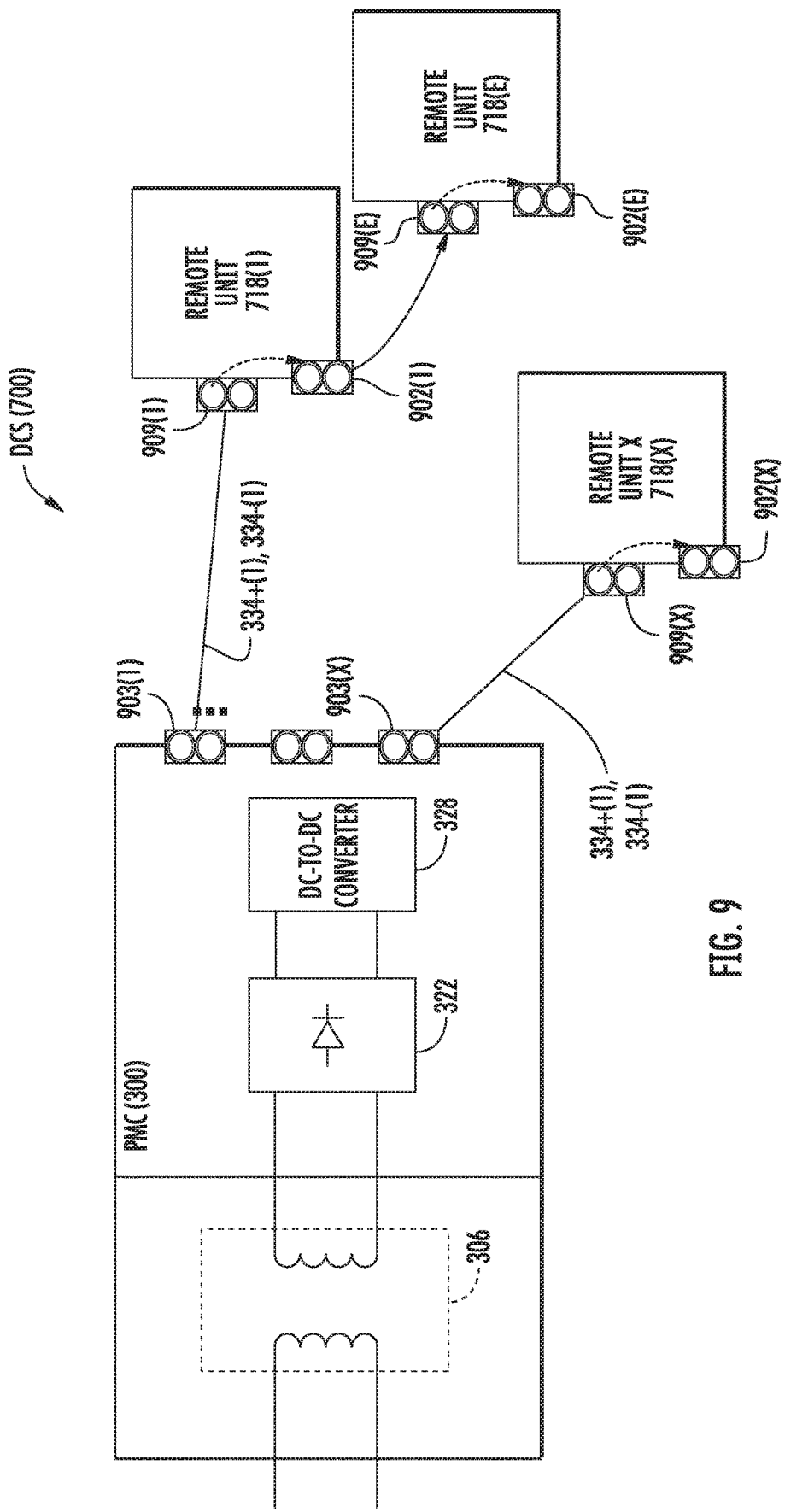
FIG. 9 is a schematic diagram of a power distribution system in a DCS according to an exemplary aspect of the present disclosure.

While the PMC 300 is well suited for use in a variety of distributed systems such as a distributed data center or a distributed lighting system, one such distributed system is explored with reference to FIGS. 7-9 for better understanding of such an exemplary environment. In particular, FIGS. 7-9 illustrate a distributed communication system with a distributed power management system that includes the PMC 300.

In this regard, FIG. 7 is a schematic diagram of such an exemplary distributed communication system (DCS) 700 having a power distribution system therein. The DCS 700 is a distributed antenna system (DAS) 702 in this example. A DAS is a system that is configured to distribute communication signals, including wireless communication signals, from a central unit to a plurality of remote units over physical communication media, to then be distributed from the remote units wirelessly to client devices in wireless communication range of a remote unit. The DAS 702 in this example is an optical fiber-based DAS that is comprised of three (3) main components. One or more radio interface circuits provided in the form of radio interface modules (RIMs) 704(1)-704(T) (generically a RIM 704) are provided in a central unit 706 to receive and process downlink electrical communication signals 708D(1)-708D(S) prior to optical conversion into downlink optical communication signals. The downlink electrical communication signals 708D(1)-708D(S) may be received from a base transceiver station (BTS) or baseband unit (BBU) as examples. The downlink electrical communication signals 708D(1)-708D(S) may be analog signals or digital signals that can be sampled and processed as digital information. The RIMs 704(1)-704(T) provide both downlink and uplink interfaces for signal processing. The notations "1-S" and "1-T" indicate that any number of the referenced component, 1-S and 1-T, respectively, may be provided.

With continuing reference to FIG. 7, the central unit 706 is configured to accept the plurality of RIMs 704(1)-704(T) as modular components that can easily be installed and removed or replaced in a chassis. In one embodiment, the central unit 706 is configured to support up to twelve (12) RIMs 704(1)-704(12). Each RIM 704(1)-704(T) can be designed to support a particular type of radio source or range of radio sources (i.e., frequencies) to provide flexibility in configuring the central unit 706 and the DAS 702 to support the desired radio sources. For example, one RIM 704 may be configured to support the Personal Communication Services (PCS) radio band. Another RIM 704 may be configured to support the 700 MHz radio band. In this example, by inclusion of these RIMs 704, the central unit 706 could be configured to support and distribute communication signals, including those for the communication services and communication bands described above as examples.

The RIMs 704(1)-704(T) may be provided in the central unit 706 that support any frequencies desired, including, but not limited to, licensed US FCC and Industry Canada frequencies (824-849 MHz on uplink and 869-894 MHz on downlink), US FCC and Industry Canada frequencies (1850-1915 MHz on uplink and 1930-1995 MHz on downlink), US FCC and Industry Canada frequencies (1710-1755 MHz on uplink and 2110-2155 MHz on downlink), US FCC frequencies (698-716 MHz and 776-787 MHz on uplink and 728-746 MHz on downlink), EU R & TTE frequencies (880-915 MHz on uplink and 925-960 MHz on downlink), EU R & TTE frequencies (1710-1785 MHz on uplink and 1805-1880 MHz on downlink), EU R & TTE frequencies (1920-1980 MHz on uplink and 2110-2170 MHz on downlink), US FCC frequencies (806-824 MHz on uplink and 851-869 MHz on downlink), US FCC frequencies (896-901 MHz on uplink and 929-941 MHz on downlink), US FCC frequencies (793-805 MHz on uplink and 763-775 MHz on downlink), and US FCC frequencies (2495-2690 MHz on uplink and downlink).

With continuing reference to FIG. 7, the received downlink electrical communication signals 708D(1)-708D(S) are provided to a plurality of optical interfaces provided in the form of optical interface modules (OIMs) 710(1)-710(W) in this embodiment to convert the downlink electrical communication signals 708D(1)-708D(S) into downlink optical communication signals 712D(1)-712D(S). The notation "1-W" indicates that any number of the referenced component 1-W may be provided. The OIMs 710 may include one or more optical interface components (OICs) that contain electrical-to-optical (E-O) converters 716(1)-716(W) to convert the received downlink electrical communication signals 708D(1)-708D(S) into the downlink optical communication signals 712D(1)-712D(S). The OIMs 710 support the radio bands that can be provided by the RIMs 704, including the examples previously described above. The downlink optical communication signals 712D(1)-712D(S) are communicated over a downlink optical fiber communication link 714D to a plurality of remote units 718(1)-718(X) provided in the form of remote antenna units in this example. The notation "1-X" indicates that any number of the referenced component 1-X may be provided. One or more of the downlink optical communication signals 712D(1)-712D(S) can be distributed to each remote unit 718(1)-718(X). Thus, the distribution of the downlink optical communication signals 712D(1)-712D(S) from the central unit 706 to the remote units 718(1)-718(X) is in a point-to-multipoint configuration in this example.

With continuing reference to FIG. 7, the remote units 718(1)-718(X) include optical-to-electrical (O-E) converters 720(1)-720(X) configured to convert the one or more received downlink optical communication signals 712D(1)-712D(S) back into the downlink electrical communication signals 708D(1)-708D(S) to be wirelessly radiated through antennas 722(1)-722(X) in the remote units 718(1)-718(X) to user equipment (not shown) in the reception range of the antennas 722(1)-722(X). The OIMs 710 may also include O-E converters 724(1)-724(W) to convert received uplink optical communication signals 712U(1)-712U(X) from the remote units 718(1)-718(X) into uplink electrical communication signals 726U(1)-726U(X) as will be described in more detail below.

With continuing reference to FIG. 7, the remote units 718(1)-718(X) are also configured to receive uplink electrical communication signals 728U(1)-728U(X) received by the respective antennas 722(1)-722(X) from client devices in wireless communication range of the remote units 718(1)-718(X). The uplink electrical communication signals 728U(1)-728U(X) may be analog signals or digital signals that can be sampled and processed as digital information. The remote units 718(1)-718(X) include E-O converters 730(1)-730(X) to convert the received uplink electrical communication signals 728U(1)-728U(X) into uplink optical communication signals 712U(1)-712U(X). The remote units 718(1)-718(X) distribute the uplink optical communication signals 712U(1)-712U(X) over an uplink optical fiber communication link 714U to the OIMs 710(1)-710(W) in the central unit 706. The O-E converters 724(1)-724(W) convert the received uplink optical communication signals 712U(1)-712U(X) into uplink electrical communication signals 732U(1)-732U(X), which are processed by the RIMs 704(1)-704(T) and provided as the uplink electrical communication signals 726U(1)-726U(X) to a source transceiver such as a base transceiver station (BTS) or baseband unit (BBU).

Note that the downlink optical fiber communication link 714D and the uplink optical fiber communication link 714U coupled between the central unit 706 and the remote units 718(1)-718(X) may be a common optical fiber communication link, wherein for example, wave division multiplexing (WDM) may be employed to carry the downlink optical communication signals 712D(1)-712D(S) and the uplink optical communication signals 712U(1)-712U(X) on the same optical fiber communication link. Alternatively, the downlink optical fiber communication link 714D and the uplink optical fiber communication link 714U coupled between the central unit 706 and the remote units 718(1)-718(X) may be single, separate optical fiber communication links, wherein for example, wave division multiplexing (WDM) may be employed to carry the downlink optical communication signals 712D(1)-712D(S) on one common downlink optical fiber and the uplink optical communication signals 712U(1)-712U(X) carried on a separate, only uplink optical fiber. Alternatively, the downlink optical fiber communication link 714D and the uplink optical fiber communication link 714U coupled between the central unit 706 and the remote units 718(1)-718(X) may be separate optical fibers dedicated to and providing a separate communication link between the central unit 706 and each remote unit 718(1)-718(X).

Relevant to the current discussion, a power source such as the external power grid 112 may provide power to the remote units 718(1)-718(X) through a power distribution system 734. The power distribution system 734 includes the PMC 300. A power signal 736 may be provided to the remote units 718(1)-718(X) through the power distribution line 334, which may be a unitary serial line for the remote units 718(1)-718(X) or parallel lines (not shown) that connect directly to each of the remote units 718(1)-718(X) or some combination of serial and parallel lines.

The DCS 700 in FIG. 7 can be provided in an indoor environment as illustrated in FIG. 8. FIG. 8 is a partially schematic cut-away diagram of a building infrastructure 800 employing the DCS 700. With reference to FIG. 8, the building infrastructure 800 in this embodiment includes a first (ground) floor 802(1), a second floor 802(2), and an Fth floor 802(F), where 'F' can represent any number of floors. The floors 802(1)-802(F) are serviced by the central unit 706 to provide antenna coverage areas 804 in the building infrastructure 800. The central unit 706 is communicatively coupled to a signal source 806, such as a BTS or BBU, to receive the downlink electrical communication signals 708D(1)-708D(S). The central unit 706 is also coupled to a power source such as external power grid 112. The central unit 706 is communicatively coupled to the remote units 718(1)-718(X) to receive the uplink optical communication signals 712U(1)-712U(X) from the remote units 718(1)-718(X) as previously described in FIG. 7. The downlink and uplink optical communication signals 712D(1)-712D(S), 712U(1)-712U(X) are distributed between the central unit 706 and the remote units 718(1)-718(X) over a riser cable 808 in this example. The riser cable 808 may be routed through interconnect units (ICUs) 810(1)-810(F) dedicated to each floor 802(1)-802(F) for routing the downlink and uplink optical communication signals 712D(1)-712D(S), 712U(1)-712U(X) and power signals 736(1)-736(X) to the remote units 718(1)-718(X). The ICUs 810(1)-810(F) may alternatively include power distribution circuits 812(1)-812(F) like the power distribution system 734 in FIG. 7 that include power sources and are configured to distribute power remotely to their respective remote units 718(1)-718(X) to provide power for operations. For example, array cables 814(1)-814(F) may be provided and coupled between the ICUs 810(1)-810(F) that contain both optical fibers to provide respective downlink and uplink optical fiber communication links 714D(1)-714D(F), 714U(1)-714U(F) and power conductors 816(1)-816(F) (e.g., electrical wire) to carry current from the respective power distribution circuits 812(1)-812(F) to the remote units 718(1)-718(X).

FIG. 9 is a schematic diagram illustrating the power distribution system 734 in the exemplary form of the DCS 700 with the PMC 300 configured to distribute power to a plurality of remote units 718(1)-718(X). Common components between the DCS 700 and the power distribution system 734 in FIG. 7 are shown with common element numbers and will not be re-described. As shown in FIG. 9, a plurality of remote units 718(1)-718(X) are provided. Each remote unit 718(1)-718(X) includes a remote power input 909(1)-909(X) coupled to the power distribution lines 334+(1), 334−(1), 334+(X), 334−(X), respectively, which are configured to be coupled to the PMC 300. The PMC 300 includes a plurality of distribution power outputs 903(1)-903(X) coupled to respective power distribution lines 334+(1), 334−(1), 334+(X), 334−(X). The power distribution lines 334+(1), 334−(1), 334+(X), 334−(X) are also coupled to the remote power inputs 909(1)-909(X). The remote units 718(1)-718(X) may also have remote power outputs 902(1)-902(X) that are configured to carry power from the respective power distribution lines 334+(1), 334−(1), 334+(X), 334−(X) received on the remote power inputs 909(1)-909(X) to an extended remote unit, such as extended remote unit 718(E).

Figure 10:
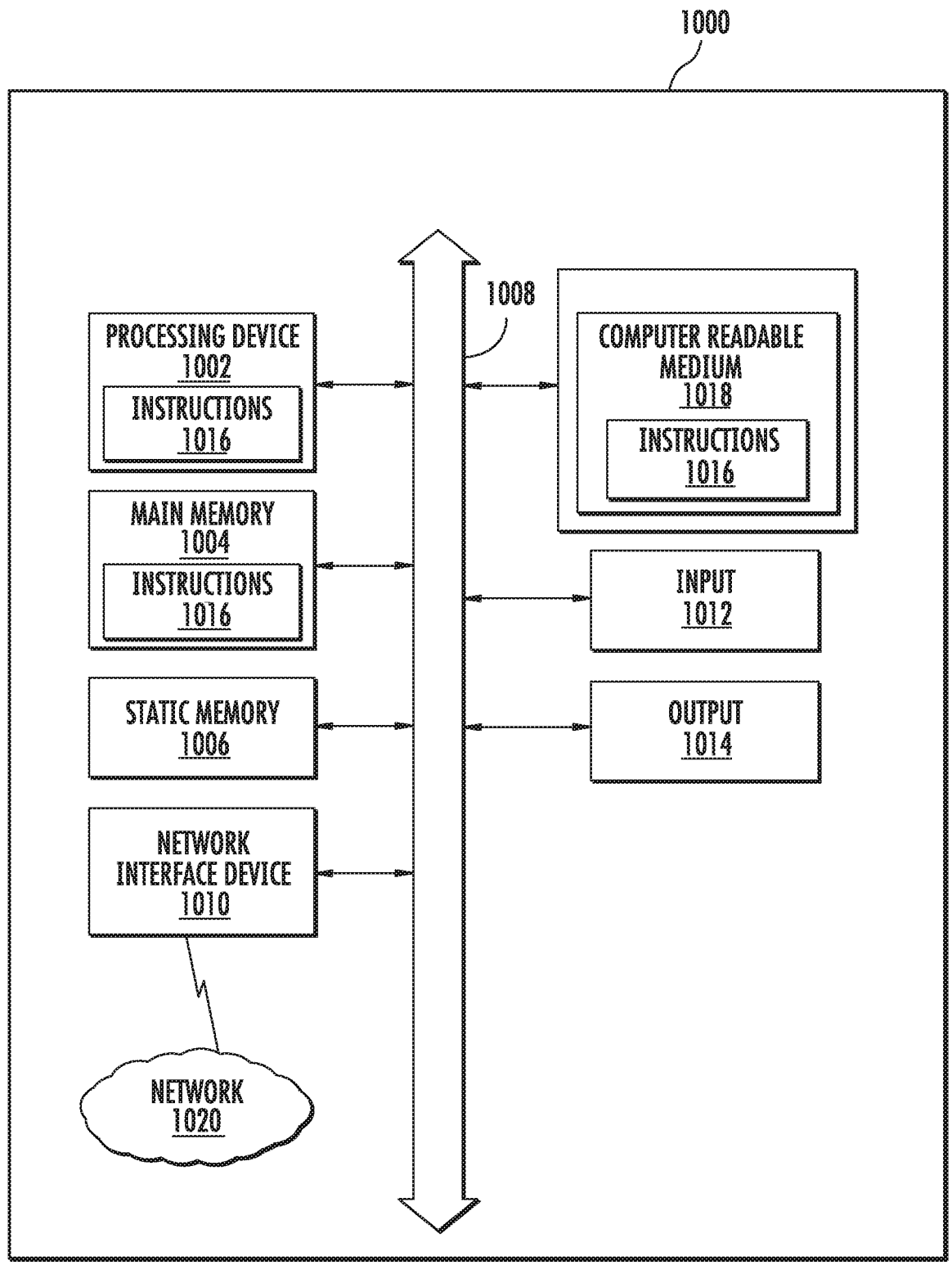
FIG. 10 is a schematic diagram of a generalized representation of an exemplary computer system that can be included in any component in a power distribution system, wherein an exemplary computer system is adapted to execute instructions from an exemplary computer readable link.

FIG. 10 is a schematic diagram representation of additional detail illustrating a computer system 1000 that could be employed in any component of a power distribution system configured to receive power from a power source and distribute the received power to one or more remote units for powering their operations. The power distribution system may be, without limitation, the power distribution systems 734 in FIG. 7. In this regard, the computer system 1000 is adapted to execute instructions from an exemplary computer-readable medium to perform these and/or any of the functions or processing described herein.

The computer system 1000 in FIG. 10 may include a set of instructions that may be executed to program and configure programmable digital signal processing circuits in a DCS for supporting scaling of supported communication services. The computer system 1000 may be connected (e.g., networked) to other machines in a local area network (LAN), an intranet, an extranet, or the Internet. While only a single device is illustrated, the term "device" shall also be taken to include any collection of devices that individually or jointly execute a set (or multiple sets) of instructions to perform any one or more of the methodologies discussed herein. The computer system 1000 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server or a user's computer.

The exemplary computer system 1000 in this embodiment includes a processing device or processor 1002, a main memory 1004 (e.g., read-only memory (ROM), flash memory, dynamic random access memory (DRAM), such as synchronous DRAM (SDRAM), etc.), and a static memory 1006 (e.g., flash memory, static random access memory (SRAM), etc.), which may communicate with each other via a data bus 1008. Alternatively, the processor 1002 may be connected to the main memory 1004 and/or static memory 1006 directly or via some other connectivity means. The processor 1002 may be a controller, and the main memory 1004 or static memory 1006 may be any type of memory.

The processor 1002 represents one or more general-purpose processing devices, such as a microprocessor, central processing unit, or the like. More particularly, the processor 1002 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processor 1002 is configured to execute processing logic in instructions for performing the operations and steps discussed herein.

The computer system 1000 may further include a network interface device 1010. The computer system 1000 also may or may not include an input 1012, configured to receive input and selections to be communicated to the computer system 1000 when executing instructions. The computer system 1000 also may or may not include an output 1014, including, but not limited to, a display, a video display unit (e.g., a liquid crystal display (LCD) or a cathode ray tube (CRT)), an alphanumeric input device (e.g., a keyboard), and/or a cursor control device (e.g., a mouse).

The computer system 1000 may or may not include a data storage device that includes instructions 1016 stored in a computer-readable medium 1018. The instructions 1016 may also reside, completely or at least partially, within the main memory 1004 and/or within the processor 1002 during execution thereof by the computer system 1000, the main memory 1004 and the processor 1002 also constituting computer-readable medium. The instructions 1016 may further be transmitted or received over a network 1020 via the network interface device 1010.

While the computer-readable medium 1018 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A power distribution system, comprising a power management circuit (PMC) comprising:
   a power source input port configured to receive an alternating current (AC) power signal from an external power grid;
   a transformer for providing isolation between the external power grid and a power distribution line, the transformer comprising:
      a transformer input port coupled to the power source input port;
      at least one input coil coupled to the transformer input port;
      at least one output coil coupled to the at least one input coil; and
      a transformer output port coupled to the at least one output coil;
   a rectifier comprising:
      an AC input port coupled to the transformer output port; and
      a rectifier output port;
      the rectifier configured to change the AC power signal into a first direct current (DC) power signal having a first voltage level and provide the first DC power signal at the rectifier output port; and
   a power factor correction (PFC) converter comprising:
      a converter input port coupled to the rectifier output port; and
      a converter output port;
      the PFC converter configured to generate a second DC power signal having a second voltage level different than the first voltage level, wherein the converter output port is configured to be coupled to a power load.

2. The power distribution system of claim 1, further comprising:
   a first housing containing the rectifier and the PFC converter; and
   a second housing containing the transformer.

3. The power distribution system of claim 2, wherein the second housing is configured to conduct heat away from the first housing.

4. The power distribution system of claim 1, wherein the power distribution line is configured to carry power to one of a data center system, a distributed communication system, and a lighting system.

5. The power distribution system of claim 1, wherein the transformer comprises the at least one output coil and the power source input port comprises a series input coupled to at least two input coils.

6. The power distribution system of claim 1, wherein the transformer comprises the at least one output coil and the power source input port comprises a parallel input coupled to at least two input coils.

7. The power distribution system of claim 1, further comprising a battery or uninterruptable power supply (UPS) coupled to the transformer output port.

8. The power distribution system of claim 1, wherein the power source input port is configured to receive a 110 volt (V) AC power signal.

9. The power distribution system of claim 1, wherein the power source input port is configured to receive one of a 240 volt (V) or a 220 (V AC power signal.

10. The power distribution system of claim 1, wherein the rectifier comprises a diode.

11. The power distribution system of claim 1, wherein the power source input port is configured to receive an AC power signal operating at or below 400 hertz (Hz).

12. The power distribution system of claim 11, further comprising paired resistors coupled to the converter output port to provide balancing.

13. The power distribution system of claim 1, wherein the converter output port is configured to provide a balanced DC output signal.

14. The power distribution system of claim 1, wherein the power load comprises the power distribution line to carry the second DC power signal thereover.

15. The power distribution system of claim 1, wherein the power load comprises a local load.

16. The power distribution system of claim 1, wherein the PFC converter configured to generate the second DC power signal is configured to generate a higher voltage level as the second DC power signal.

17. The power distribution system of claim 1, wherein the PFC converter configured to generate the second DC power signal is configured to generate a lower voltage level as the second DC power signal.

18. The power distribution system of claim 1, wherein the converter output port is configured to provide an unbalanced, relative to a ground, DC output signal.

19. A distributed communication system (DCS), comprising:
- a central unit configured to:
  - distribute one or more downlink communication signals over one or more downlink communication links to a plurality of remote units; and
  - distribute received one or more uplink communication signals from the plurality of remote units from one or more uplink communication links to one or more source communication outputs;
- the plurality of remote units, each remote unit among the plurality of remote units configured to:
  - distribute at least one received downlink communication signal among the one or more downlink communication signals from the one or more downlink communication links to one or more client devices; and
  - distribute the one or more uplink communication signals from the one or more client devices to the one or more uplink communication links; and
- a power distribution circuit, comprising:
  - a power source input port configured to receive an alternating current (AC) power signal from an external power grid;
  - a transformer for providing isolation between the external power grid and a power distribution line, the transformer comprising:
    - a transformer input port coupled to the power source input port;
    - at least one input coil coupled to the transformer input port;
    - at least one output coil coupled to the at least one input coil; and
    - a transformer output port coupled to the at least one output coil;
  - a rectifier comprising:
    - an AC input port coupled to the transformer output port; and
    - a rectifier output port;
    - the rectifier configured to change the AC power signal into a first direct current (DC) power signal having a first voltage level and provide the first DC power signal at the rectifier output port; and
  - a power factor correction (PFC) converter comprising:
    - a converter input port coupled to the rectifier output port; and
    - a converter output port;
    - the PFC converter configured to generate a second DC power signal having a second voltage level different than the first voltage level, wherein the converter output port is configured to be coupled to the power distribution line to carry the second DC power signal thereover.

20. The DCS of claim 19, further comprising a distributed antenna system (DAS).

21. The DCS of claim 19, further comprising a small cell radio access network (RAN).

* * * * *